United States Patent [19]
Carlson et al.

[11] Patent Number: 6,037,271
[45] Date of Patent: Mar. 14, 2000

[54] LOW HAZE WAFER TREATMENT PROCESS

[75] Inventors: Brent D. Carlson, Norwood-Young America; Erik D. Olson, Burnsville; James R. Oikari, Eden Prairie, all of Minn.

[73] Assignee: FSI International, Inc., Chaska, Minn.

[21] Appl. No.: 09/176,588

[22] Filed: Oct. 21, 1998

[51] Int. Cl.[7] .................................................. H01L 21/00
[52] U.S. Cl. .................... 438/751; 438/754; 438/756; 252/79.3
[58] Field of Search .................................. 438/745, 748, 438/749, 750, 751, 754, 756; 216/83, 92, 95, 99, 100, 102, 104, 109; 156/345 LS; 252/79.2, 79.3

[56] References Cited

U.S. PATENT DOCUMENTS

| | | | |
|---|---|---|---|
| 3,607,480 | 9/1971 | Harrap et al. | 252/79.3 X |
| 3,923,567 | 12/1975 | Lawrence | 156/7 |
| 4,009,299 | 2/1977 | Flowers et al. | 427/82 |
| 4,261,791 | 4/1981 | Shwartzman | 156/628 |
| 4,778,532 | 10/1988 | McConnel et al. | 134/10 |
| 4,891,325 | 1/1990 | Hezel et al. | 437/2 |
| 5,626,715 | 5/1997 | Rostoker . | |
| 5,656,097 | 8/1997 | Olesen et al. | 134/1 |
| 5,933,739 | 8/1999 | Lin | 438/756 X |

*Primary Examiner*—William Powell
*Attorney, Agent, or Firm*—Vidas, Arrett & Steinkraus, P.A.

[57] ABSTRACT

A process for removing a plurality of layers of different materials from a substrate having a silicon material base, at least one of said layers being a silicon oxide material and at least one other of said layers comprising a metal and the metal layer being located above the silicon oxide layer. The process includes the steps of treating the substrate with a series of chemical formulations adapted to successively remove the materials of the plurality of layers until the silicon material base is exposed, the silicon oxide layer being removed by treatment with HF, wherein the HF treatment to remove said silicon oxide layer comprises exposing the substrate to:

initially, a dilute HF solution of no more than 1.0% concentration;

subsequently, a concentrated HF solution of from about 2.5% to about 10% concentration; and finally, a dilute HF solution of no more than 1.0% concentration.

15 Claims, 2 Drawing Sheets

LOW HAZE WAFER TREATMENT PROCESS

BACKGROUND OF THE INVENTION

In the manufacture of semiconductors and other silicon wafer devices such as photovoltaic cells, wafers are frequently generated which cannot be processed into finished product. Sometimes these wafers are process rejects, other times they may be calibration wafers used to set or verify manufacturing process parameters. Reclamation of such wafers, even if only to allow reuse in process calibration, can provide significant cost savings in the manufacturing process. To accomplish reclamation, multiple layers of different materials may have to be removed. At least one of the layers is typically a silicon oxide layer. Mechanical polishing can be employed but it is expensive and time consuming. In some cases chemical stripping using multiple chemical solutions can be effectively employed to strip a wafer back to a mirror finish silicon surface. However, in very many cases the chemically stripped wafer is left with a hazy appearance which renders it unsuitable for reuse. The haze is resistant to removal by chemicals which do not attack the underlying silicon. The problem is particularly prevalent when an overlying layer contains aluminum, although aluminum has not been identified in the haze itself. In multi-layer stacks, the presence of aluminum seems to be associated with haze formation even though the aluminum is many layers above the silicon wafer surface. Since aluminum metal lines are ubiquitous on semiconductor devices, this haze is a serious problem for chemical wafer reclamation. The aluminum used in semiconductors typically contains trace levels of copper and silicon.

U.S. Pat. No. 4,261,791, Shwartzman (RCA Corp.), discloses a method of cleaning silicon wafers. In the first step, following a water rinse, the wafers are subjected to a film forming solution comprising 99.1% to 99.5% by volume of a 49% HF solution by weight and 0.5% to 0.9% by volume of a 70% $HNO_3$ solution by weight. In the second step, the wafers are subject to a stripping solution comprising 1% to 5% by volume of the HF solution and 95% to 99% by volume of the $HNO_3$ solution. This reference does not disclose a process to reduce or prevent haze formation on a substrate.

U.S. Pat. No. 5,656,097, Olesen et al. (Verteq, Inc.), discloses a method for cleaning of semiconductor wafers in which the wafers are subjected to sequential flows of highly dilute cleaning solution. The sequence generally involves a first treatment with a solution comprising $H_2O/H_2O_2$ and $NH_4OH$, followed by a second treatment using a buffered oxide etching solution such as $H_2O/HF$. A third treatment, again comprising $H_2O/H_2O_2$ and $NH_4OH$, is followed by a fourth treatment comprising HCl. Again, the reference does not disclose a process to reduce or prevent haze formation on a substrate.

U.S. Pat. No. 3,923,567, Lawrence (Silicon Materials, Inc.), discloses a method of reclaiming a semiconductor wafer. The method involves drawing impurities to the wafer surface and chemical etching to remove point defects, grinding the back surface of the wafer and finally polishing the front of the wafer.

U.S. Pat. No. 4,891,325, Hezel et. al. (Nukem GmbH), discloses a method for reusing silicon base material of defective MIS inversion-layer solar cells using mineral acids such as $O-H_3PO_4$ to remove an insulating layer and a electrically conductive contact. The reference does not disclose a process for the prevention or removal of haze.

U.S. Pat. No. 4,778,532, McConnell et al. (CFM Technologies Limited Partnership), discloses an apparatus and method for reducing contamination of wafers. The apparatus and method do not require handling of the wafers between processing steps. The reference contemplates the use of acids, but it does not disclose a process for removing haze in wafer reclamation.

U.S. Pat. No. 4,009,299, Flowers et al. (Motorola, Inc.), discloses a process for reclamation of semiconductor devices in which defective tin plated leads are removed. The process is not applied to the prevention or removal of haze.

U.S. Pat. No. 5,626,715, Rostoker (LSI Logic Corporation), discloses a method of polishing semiconductor substrates. The method is directed to the use of a polishing pad rather than the chemical removal of contaminants.

SUMMARY OF THE INVENTION

The invention is a process which allows for reclamation of wafers by chemical means without forming the intractable haze described above. The inventors have discovered that the formation of haze commonly encountered when attempting to chemically reclaim a wafer having a layer stack including silicon oxide and a metal such as aluminum located in a layer above the silicon oxide, can be substantially minimized by a modification of the method by which the silicon oxide layer is removed.

According to the inventive process, the overlying metal layer is removed using a conventional metal etch chemistry and sequence. The subsequent silicon oxide removal step, however, involves a sequential treatment with HF at different dilutions. Specifically, the silicon oxide removal process uses an initial treatment interval employing a dilute HF solution (no more than 1% concentration), a second treatment interval employing a relatively more concentrated HF solution (from about 2.5% to about 10%), and a final treatment interval once again employing a dilute HF solution. The process may utilize only these three intervals, or it may employ multiple cycles of dilute and more concentrated HF treatment intervals between the second and final treatment intervals.

Surprisingly the inventive process has been shown to provide substantially improved results even when there are other material layers between the metal layer and the silicon oxide layer, which other layer materials must be removed by different chemical processes.

DETAILED DESCRIPTION OF THE INVENTION

Figure 1:
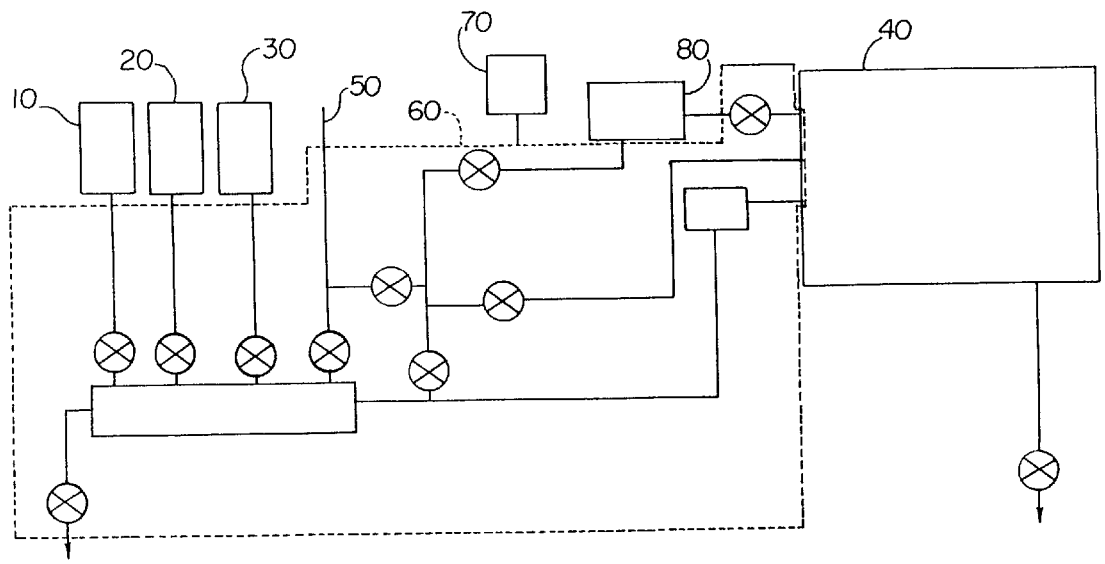
FIG. 1 is a schematic representation of an apparatus specially for carrying out the process of the invention.

Without being bound thereby, it is believed that the haze problem, described above, involves small amounts of silicon found in the Al or in another material on the wafer surface which is not removed in the various processes and therefore migrates down to the wafer surface as the overlying layers are successively removed. Silicon is present in the aluminum alloy commonly used on semiconductors at a level of about 3%. Silicon is not etched during exposure to conventional metals removal chemicals or during exposure to chemicals which remove other common layers such as TiN, and is only slightly etched relative to silicon oxide when HF concentrations conventional for silicon oxide removal are used. Consequently silicon can migrate to the silicon surface during a conventional HF etch. However, at lower HF concentrations where silicon oxide etch is impractically slow silicon is removed at a relatively higher rate. Therefore, by running the silicon oxide etch at a low initial concentration, migration of silicon can be substantially reduced.

It appears however from the work of the inventors that initial dilute HF treatment cannot fully prevent haze, possibly because some of the silicon from overlying layers penetrates or spikes into the silicon oxide layer. The inventors have achieved success in eliminating haze when, a dilute HF treatment is followed by a concentrated HF treatment to remove bulk silicon oxide and then by a dilute treatment again. In some cases it may be preferable to break the silicon oxide removal process up into several cycles to obtain maximum reduction of haze. For instance the requisite cycle of the invention, namely (1)dilute, (2)concentrated, (3)dilute, may be part of a more complex treatment cycle such as (1)dilute, (2)concentrated, (dilute, concentrated), (3) dilute; or (1)dilute, (2)concentrated, (dilute, rinse, dilute, concentrated)$_n$, (3) dilute with n equal to one or more. In general, the haze removal benefit obtained when interrupting the bulk silicon oxide removal step with multiple dilute HF treatment steps is offset somewhat by the extended processing time required.

The duration of the respective HF treatments will depend on the silicon oxide film thickness, its compositional characteristics, the specific HF concentrations used and the temperature at which the reaction is run. Temperatures in the range of 20 to about 90° C. may be employed. In general, a suitable initial treatment with dilute HF will be one which extends for a time sufficient to etch about 5–10% of the silicon oxide layer. Desirably the silicon oxide etch cycle results in a small over-etch of silicon during dilute HF treatment. This can be accomplished by timing the final dilute etch step of the treatment cycle to be initiated after about 90–98% of the silicon oxide layer has been removed, more preferably about 95%, and continuing the dilute cycle for duration sufficient to obtain an over-etch of approximately 2–10% of the depth of the silicon oxide layer, preferably about 5%. The intermediate treatment(s), including the concentrated HF treatment(s), should be timed to effect removal of the remaining bulk of the silicon oxide layer.

A further aspect of the invention, illustrated in FIG. 1, is a spray processing apparatus comprising a spray chamber (40), a plurality of chemical supply reservoirs (10, 20, 30) including a first reservoir (10) containing therein a concentrated HF solution and a second reservoir (20) containing therein sulfuric or hydrochloric acid;

a water source (50);

a controllable conduit system (60) for providing a spray of chemicals from said reservoirs or water or mixtures thereof as a spray on a substrate in the spray chamber, the conduit system including piping, spray nozzles in the chamber, a system of controllable valves and associated sensors to ascertain flow rate; and a programmable controller (70) for the conduit system having a program entered into the controller, and communicating to the conduit system valves and sensors, whereby a specific sequence of sprays of water or chemical or mixtures thereof are provided to the spray chamber, the program being configured to provide a spray sequence comprising:

a) a composition comprising sulfuric or hydrochloric acid for a time effective for removing a metal layer from a substrate having said metal layer thereon overlying a layer of silicon oxide; and b) subsequently a treatment with HF for a time effective to remove said silicon oxide layer, wherein the programmed HF treatment effects a sequence comprising:

initially, a dilute HF solution of no more than 1.0% concentration;

subsequently, a concentrated HF solution of from about 2.5% to about 10% concentration; and finally, a dilute HF solution of no more than 1.0% concentration. Such an apparatus can be prepared by modifying a known programmable spray processing machine such as a MERCURY MP Spray Processing System sold by FSI International Inc., by providing the chemical reservoirs thereof with the necessary solutions and by configuring the machine's controller with a program as indicated herein. In a preferred embodiment at least one other chemical reservoir (30) is provided containing hydrogen peroxide solution and the program is configured such that the composition provided in step a), above is an SPM or HPM mixture as illustrated in the examples below. A nitrogen source (80) is suitably also provided. Further reservoirs may be added, for instance containing ammonium hydroxide solution to allow preparation of APM solution.

The invention is illustrated by the following illustrative examples. In the examples dilution ratios given are mix ratios of the indicated starting chemicals and are not corrected for the starting concentration of the chemicals. Thus, 49% HF diluted with water at a 100:1 water:HF ratio has a true HF concentration of about 0.49%

EXAMPLE 1 (COMPARATIVE EXAMPLE)

Materials and Chemicals

MERCURY MP Spray Processing System equipped with 8 position, 5", turntable (FSI International Inc.)

Infrared Chemical Heater (FSI International Inc.)

HELIOS® 52 DI Water Heater

A190-50M Cassette (Fluoroware Inc.)

Sulfuric Acid (96%) Semi-Grade

Hydrogen Peroxide (30%) Semi-Grade

Ammonium Hydroxide (29%) Semi-Grade

Hydrofluoric Acid (49%) Semi-Grade

DI Water

Experimental

A total of one-hundred and forty three, (5 wafers were used as controls) 125 mm silicon wafers were received for processing. Different films had been deposited on each group of wafers as follows:

TABLE 1

| Set No | No of wafers | description |
|---|---|---|
| 1 | 14 | 5" wafers with 6KÅ Al on 4KÅ PECVD $SiO_2$ |
| 2 | 9 | 5" wafers with 10KÅ Al on 4KÅ PECVD $SiO_2$ |
| 3 | 10 | 5" wafers with 600Å Ti on silicon |
| 4 | 25 | 5" wafers with 50KÅ Al on silicon |

TABLE 1-continued

| Set No | No of wafers | description |
|---|---|---|
| 5 | 21 | 5" wafers with 400Å TiN on silicon |
| 6 | 13 | 5" wafers with 4KÅ PECVD SiO$_2$ |
| 7 | 4 | 5" wafers with 20KÅ PECVD SiO$_2$ |
| 8 | 2 | 5" wafers with 16KÅ PECVD SiO$_2$ |
| 9 | 10 | 5" wafers with 10KÅ Al on 1KÅ PECVD SiO$_2$ |
| 10 | 10 | 5" wafers with 10KÅ Al on silicon |
| 11 | 5 | 5" wafers with 6KÅ Al on silicon |
| 12 | 2 | 5" wafers with 10KÅ Al on 400Å TiN |
| 13 | 6 | 5" wafers with 800Å TiN on 4KÅ PECVD SiO$_2$ |
| 14 | 4 | 5" wafers with 800Å TiN on 6KÅ Al on 4KÅ PECVD SiO$_2$ |
| 15 | 5 | 5" wafers with 400Å TiN on 10KÅ Al | cc/min. All of the processing was done at ambient room temperature. After the oxide was stripped, the wafers were finished with APM for particle removal and oxide regrowth.

Discussion/Results

All of the wafers appeared to be cleared to bare silicon (i.e. to the underlying wafer material with no films or patterns remaining). Some over etch was incorporated into the process times to ensure complete removal of films. However, it was noticed that all of the wafers that were coated with metal were severely hazed. It was considered unlikely that these chemistries would have etched silicon.

Another alternative to SPM would be the use of Hydrochloric acid, Hydrogen Peroxide, DI water Mixture (HPM) for the removal of aluminum.

TABLE 2

| Box Letter | Set # | # of Wafers per Run | Layer 1 Thickness (kA) | Layer 1 Material | Layer 2 Thickness (kA) | Layer 2 Material | Layer 3 Thickness (kA) | Layer 3 Material | Process Times (sec) SPM | HF | APM |
|---|---|---|---|---|---|---|---|---|---|---|---|
| A | 1 | 14 | 6 | Al | 4 | PECVD SiO2 | n/a | Si | 440 | 240 | 180* |
| A | 2 | 9 | 10 | Al | 4 | PECVD SiO2 | n/a | Si | 520 | 240 | 180* |
| B | 3 | 10 | 0.6 | Ti | n/a | Si | | | | | 300 |
| C | 4 | 25 | 50 | Al | n/a | Si | | | 800 | 120 | 180* |
| C | 5 | 21 | 0.4 | TiN | n/a | Si | | | | | 300 |
| D | 6 | 13 | 4 | PECVD SiO2 | n/a | Si | | | | 240 | |
| D | 7 | 4 | 20 | PECVD SiO2 | n/a | Si | | | | 600 | |
| D | 8 | 2 | 16 | PECVD SiO2 | n/a | Si | | | | 720 | |
| F | 9 | 10 | 10 | Al | 1 | PECVD SiO2 | n/a | Si | 520 | 60 | 180* |
| F | 10 | 10 | 10 | Al | n/a | Si | | | 520 | 60 | 180* |
| F | 11 | 5 | 6 | Al | n/a | Si | | | 440 | 60 | 180* |
| G | 12 | 2 | 10 | Al | 0.4 | TiN | n/a | Si | 520 | 60 | 300 |
| G | 13 | 6 | 0.8 | TiN | 4 | PECVD SiO2 | n/a | Si | | 240 | 480 |
| G | 14 | 4 | 0.8 | TiN | 6 | Al | 6 | PECVD SiO2 | 440 | 240 | 480 |
| G | 15 | 5 | 0.4 | TiN | 10 | Al | n/a | Si | 520 | 60 | 300 |
| G | 16 | 3 | 0.4 | TiN | 10 | Al | 1 | PECVD SiO2 | 520 | 60 | 300 |

*These APM times were standard 0.5:1.6 for particle removal and oxide regrowth. All other times were heated 1:1:5 ratios.

TABLE 1-continued

| Set No | No of wafers | description |
|---|---|---|
| 16 | 3 | 5" wafers with 400Å TiN on 10KÅ Al on 1KÅ PECVD SiO$_2$ |

The wafers were processed in the Mercury MP spray processor using the individual solutions and processing times shown in Table 2. The following is a summary of the processes run on the various films:

Aluminum Films

All of the aluminum films were removed using SPM solutions in conjunction with an infra-red chemical heater set to 95° C. To produce SPM, a of 4:1 was used with flow rates of 600 cc/min. H$_2$SO$_4$ and 150 cc/min. H$_2$O$_2$. All of the aluminum coated wafers were finished with HF and APM solutions for residual Cu/Si cleanup, particle removal, and to regrow a chemical oxide.

Titanium/Titanium Nitride Films

All of the titanium and titanium nitride films were removed using APM solutions in conjunction with an infra-red chemical heater set to 95° C. When APM is called, a ratio of 1:1:5 was used with flow rates of 250 cc/min. NH$_4$OH, 250 cc/min. H$_2$O$_2$ and 1250 cc/min., DI water respectively.

PECVD Oxide Films

Dilute HF was on-line blended from 49% HF at a 1:5 dilution with DI water and applied with a flow rate of 1500

EXAMPLE 2 (INVENTION EXAMPLE)

Materials and Chemicals

MERCURY MP Spray Processing System
HELIOSS® 52 DI Water Heater
8 Position 125 mm Turntable
Fluoroware A190-50M Cassette
Bright Light
Hydrochloric Acid (37%) Semi-Grade
Hydrogen Peroxide (30%) Semi-Grade
Hydrofluoric Acid (49%) Semi-Grade
DI Water Experimental In various experiments on 5" wafers with 6, 8 or 10K Å Al on 4K Å PECVD SiO$_2$, it was determined that the HPM successfully removes the aluminum film. However, severe hazing and residues similar to the earlier processed wafers using SPM-HF was initially obtained. However through considerable process variations this hazing problem was eventually virtually eliminated. The starting process used 6 minutes of 3:3:10 HPM (hydrochloric acid:hydrogen peroxide:water) and 4 minutes of 5:1 concentrated HF (water:HF). While this appeared to clear both film stacks, the wafer was severely hazed when observed using a bright light. When 100:1 HF was dispensed both in front, and in back, of the 5:1 HF, a reduction of haze was observed. After many process iterations changing both time and concentration the process described in Table 3 below proved successful for all three sets of wafers.

TABLE 3

| Time/minutes | Concentration | Chemistry |
|---|---|---|
| 2 | 3:3:10 | HPM |
| 2 | 100:1 | HF |
| 1.5 | 10:1 | HF |
| 2 | 100:1 | HF |
| — | — | Rinse |

Note: Repeat twice for a total 3 dispenses.

EXAMPLE 3

Figure 2:
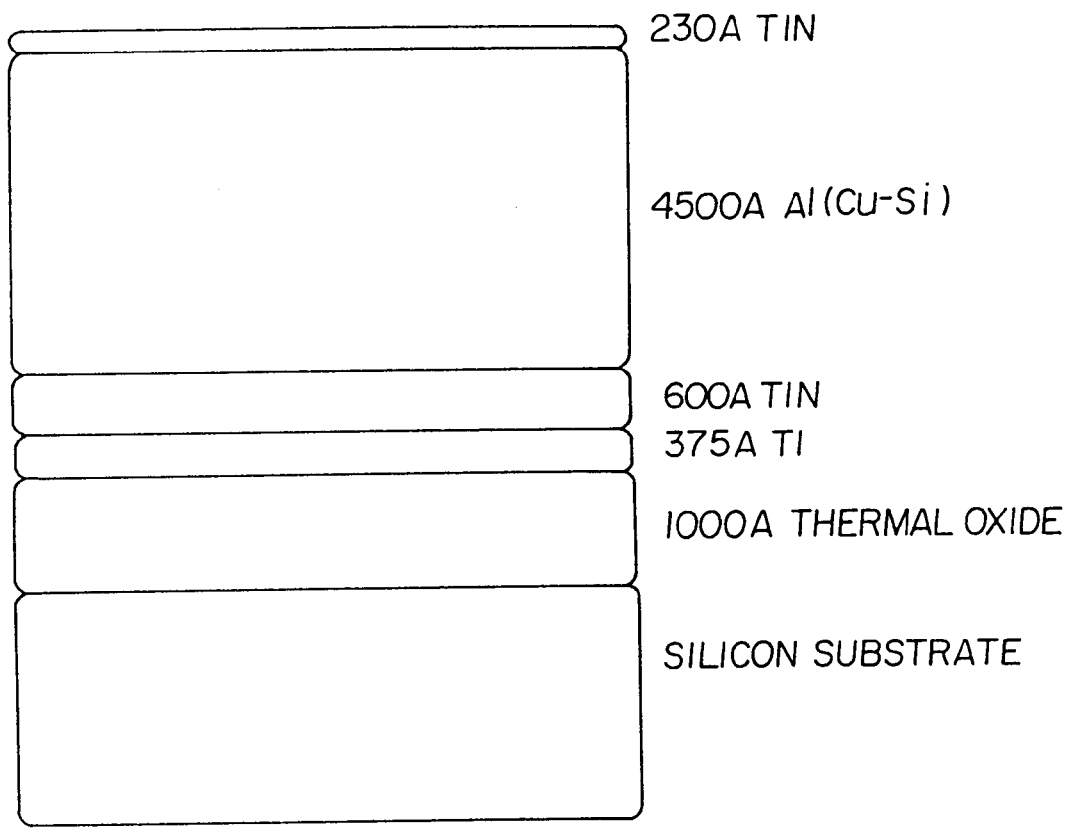
FIG. 2 shows a schematic side sectional view of a silicon wafer substrate having a film stack thereon to be removed for reclamation.

A wafer containing a film stack as shown in FIG. 2 was to be removed to bare silicon for wafer reclaim. An apparatus as in the previous examples was used with the following sequence of steps:

TiN removal
　The top TiN layer was removed using a treatment of APM, prepared as in Example 1, for 3 minutes.
Al removal
　The Al layer was removed using a treatment of HPM, prepared as in Example 2, for 4 minutes.
TiN/Ti removal
　Both the TiN and Ti layers were removed using an 8 minute treatment of APM, prepared as in Example 1.
Thermal oxide removal
　The thermal silicon oxide layer was removed using a treatment cycle of the invention of 3 minutes 100:1 HF, 14 minutes 10:1 HF and 3 minutes 10:1 HF, the solutions being prepared as in Example 2.
　The wafer was successfully cleared to bare silicon without haze.

We claim:

1. A process for removing a plurality of layers of different materials from a substrate having a silicon material base, at least one of said layers being a silicon oxide material and at least one other of said layers comprising a metal, the metal layer being located above the silicon oxide layer, the process comprising treating the substrate with a series of chemical formulations adapted to successively remove the materials of said plurality of layers until the silicon material base is exposed, the silicon oxide layer being removed by treatment with HF, wherein the HF treatment to remove said silicon oxide layer comprises exposing the substrate to:
　a dilute HF solution of no more than 1.0% concentration;
　subsequently, a concentrated HF solution of from about 2.5% to about 10% concentration; and
　finally, a dilute HF solution of no more than 1.0% concentration.

2. A process as in claim 1 wherein said concentrated HF solutions have a HF concentration of not more than 8%.

3. A process as in claim 2 wherein said concentrated HF solutions have a HF concentration of from about 3.0% to about 6.0%.

4. A process as in claim 1 wherein said dilute HF solutions have a HF concentration of from about 0.2% to about 0.8%.

5. A process as in claim 4 wherein said dilute HF solutions have a HF concentration of from about 0.4% to about 0.6%.

6. A process as in claim 1 wherein said metal layer comprises aluminum.

7. A process as in claim 1 wherein said metal layer is an aluminum alloy which comprises silicon and copper, each in an amount of less than 1% based on aluminum weight.

8. A process as in claim 1 wherein said metal layer is removed by treatment with an aqueous solution of hydrogen peroxide and an acid selected from the group consisting of sulfuric acid and hydrochloric acid.

9. A process as in claim 1 wherein said plurality of layers includes a titanium nitride layer, the titanium nitride being removed with a solution of ammonium hydroxide and hydrogen peroxide.

10. A process as in claim 1 wherein said plurality of layers includes a titanium layer, the titanium being removed with a solution of ammonium hydroxide and hydrogen peroxide.

11. A process as in claim 1 wherein after said silicon material base is exposed the substrate is treated with a solution comprising hydrogen peroxide to provide the substrate with a thin protective oxide layer.

12. A process as in claim 1 wherein the temperature of the HF treatment solutions is from about 20° C. to about 90° C.

13. A process as in claim 1 wherein the sequential exposure steps are accomplished by spraying said solutions onto the substrate in a spray processor apparatus.

14. A process as in claim 1 wherein said initial dilute HF exposure is performed for a time which results in removal of approximately 5–10% of the silicon oxide layer and the final of said dilute HF exposures is initiated after at least 90% of the silicon oxide layer has been removed and is continued for a time longer than necessary to remove all of the remaining silicon oxide layer.

15. A spray processing apparatus comprising
　a spray chamber,
　a plurality of chemical supply reservoirs including a first reservoir containing therein a concentrated HF solution and a second reservoir containing therein sulfuric or hydrochloric acid;
　a water source,
　a controllable conduit system for providing a spray of chemicals from said reservoirs or water or mixtures thereof as a spray on a substrate in the spray chamber, and
　a programmable controller for the conduit system having a program entered into the controller whereby a specific sequence of sprays of water or chemical or mixtures thereof are provided to the spray chamber, the program being configured to provide a spray sequence comprising:
　　a) a composition comprising sulfuric or hydrochloric acid for a time effective for removing a metal layer from a substrate having said metal layer thereon overlying a layer of silicon oxide; and
　　b) subsequently a treatment with HF for a time effective to remove said silicon oxide layer,
　wherein the programmed HF treatment effects a sequence comprising:
　　initially, a dilute HF solution of no more than 1.0% concentration;
　　subsequently, a concentrated HF solution of from about 2.5% to about 10% concentration; and
　　finally, a dilute HF solution of no more than 1.0% concentration.

\* \* \* \* \*